(12) United States Patent
Perlmutter et al.

(10) Patent No.: US 8,482,978 B1
(45) Date of Patent: Jul. 9, 2013

(54) ESTIMATION OF MEMORY CELL READ THRESHOLDS BY SAMPLING INSIDE PROGRAMMING LEVEL DISTRIBUTION INTERVALS

(75) Inventors: Uri Perlmutter, Ra'anana (IL); Shai Winter, Giva'ataim (IL); Eyal Gurgi, Petach Tikva (IL); Oren Golov, Hod Hasharon (IL); Micha Anholt, Tel Aviv (IL)

(73) Assignee: Apple Inc., Cupertino, CA (US)

( * ) Notice: Subject to any disclaimer, the term of this patent is extended or adjusted under 35 U.S.C. 154(b) by 143 days.

(21) Appl. No.: 13/170,202

(22) Filed: Jun. 28, 2011

Related U.S. Application Data (63) Continuation-in-part of application No. 12/558,528, filed on Sep. 13, 2009, now Pat. No. 8,000,135.

(60) Provisional application No. 61/096,806, filed on Sep. 14, 2008.

(51) Int. Cl.
*G11C 11/34* (2006.01)

(52) U.S. Cl.
USPC ............ 365/185.03; 365/185.09; 365/185.24; 365/185.22

(58) Field of Classification Search
USPC .............. 365/185.03, 185.09, 185.24, 185.22
See application file for complete search history.

(56) References Cited

U.S. PATENT DOCUMENTS

| | | | |
|---|---|---|---|
| 3,668,631 A | 6/1972 | Griffith et al. | |
| 3,668,632 A | 6/1972 | Oldham | |
| 4,058,851 A | 11/1977 | Scheuneman | |
| 4,112,502 A | 9/1978 | Scheuneman | |
| 4,394,763 A | 7/1983 | Nagano et al. | |
| 4,413,339 A | 11/1983 | Riggle et al. | |
| 4,556,961 A | 12/1985 | Iwahashi et al. | |
| 4,558,431 A | 12/1985 | Satoh | |
| 4,608,687 A | 8/1986 | Dutton | |
| 4,654,847 A | 3/1987 | Dutton | |

(Continued)

FOREIGN PATENT DOCUMENTS

| | | |
|---|---|---|
| EP | 0783754 B1 | 7/1997 |
| EP | 1434236 B1 | 6/2004 |

(Continued)

OTHER PUBLICATIONS

U.S. Appl. No. 12/323,544 Official Action dated Mar. 9, 2012.

(Continued)

*Primary Examiner* — Viet Q Nguyen
(74) *Attorney, Agent, or Firm* — Meyertons, Hood, Kivlin, Kowert & Goetzel PC (57) ABSTRACT

A method for data storage includes storing data in a group of analog memory cells by writing into the memory cells in the group respective storage values, which program each of the analog memory cells to a respective programming state selected from a predefined set of programming states, including at least first and second programming states, which are applied respectively to first and second subsets of the memory cells, whereby the storage values held in the memory cells in the first and second subsets are distributed in accordance with respective first and second distributions. A first median of the first distribution is estimated, and a read threshold, which differentiates between the first and second programming states, is calculated based on the estimated first median. The data is retrieved from the analog memory cells in the group by reading the storage values using the calculated read threshold.

28 Claims, 3 Drawing Sheets

U.S. PATENT DOCUMENTS

| | | |
|---|---|---|
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotra et al. |
| 5,182,558 A | 1/1993 | Mayo |
| 5,182,752 A | 1/1993 | DeRoo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,533,190 A | 7/1996 | Binford et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koening |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,799,200 A | 8/1998 | Brant et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,428 A | 2/1999 | Ishii et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A | 11/1999 | Ishii et al. |
| 5,991,517 A | 11/1999 | Harari et al. |
| 5,995,417 A | 11/1999 | Chen et al. |
| 6,009,014 A | 12/1999 | Hollmer et al. |
| 6,009,016 A | 12/1999 | Ishii et al. |
| 6,023,425 A | 2/2000 | Ishii et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,151,246 A | 11/2000 | So et al. |
| 6,157,573 A | 12/2000 | Ishii et al. |
| 6,166,962 A | 12/2000 | Chen et al. |
| 6,169,691 B1 | 1/2001 | Pasotti et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,314,044 B1 | 11/2001 | Sasaki et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 | 5/2002 | Ishii et al. |
| 6,392,932 B1 | 5/2002 | Ishii et al. |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yong et al. |
| 6,438,037 B1 * | 8/2002 | Fastow et al. ............ 365/185.22 |
| 6,442,585 B1 | 8/2002 | Dean et al. |
| 6,445,602 B1 | 9/2002 | Kokudo et al. |
| 6,452,838 B1 | 9/2002 | Ishii et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,480,948 B1 | 11/2002 | Virajpet et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,549,464 B2 | 4/2003 | Tanaka et al. |
| 6,553,510 B1 | 4/2003 | Pekny et al. |
| 6,558,967 B1 | 5/2003 | Wong |
| 6,560,152 B1 | 5/2003 | Cernea |
| 6,567,311 B2 | 5/2003 | Ishii et al. |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzalez et al. |
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,683,811 B2 | 1/2004 | Ishii et al. |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |
| 6,732,250 B2 | 5/2004 | Durrant |
| 6,738,293 B1 | 5/2004 | Iwahashi |
| 6,751,146 B1 * | 6/2004 | Wang et al. ............ 365/222 |
| 6,751,766 B2 | 6/2004 | Guterman et al. |
| 6,757,193 B2 | 6/2004 | Chen et al. |

| Patent No. | Date | Inventor |
|---|---|---|
| 6,768,676 B2 * | 7/2004 | Hirano .................. 365/185.18 |
| 6,774,808 B1 | 8/2004 | Hibbs et al. |
| 6,781,877 B2 | 8/2004 | Cernea et al. |
| 6,804,805 B2 | 10/2004 | Rub |
| 6,807,095 B2 | 10/2004 | Chen et al. |
| 6,807,101 B2 | 10/2004 | Ooishi et al. |
| 6,809,964 B2 | 10/2004 | Moschopoulos et al. |
| 6,819,592 B2 | 11/2004 | Noguchi et al. |
| 6,829,167 B2 | 12/2004 | Tu et al. |
| 6,845,052 B1 | 1/2005 | Ho et al. |
| 6,851,018 B2 | 2/2005 | Wyatt et al. |
| 6,851,081 B2 | 2/2005 | Yamamoto |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,870,773 B2 | 3/2005 | Noguchi et al. |
| 6,873,552 B2 | 3/2005 | Ishii et al. |
| 6,879,520 B2 | 4/2005 | Hosono et al. |
| 6,882,567 B1 | 4/2005 | Wong |
| 6,894,926 B2 | 5/2005 | Guterman et al. |
| 6,907,497 B2 | 6/2005 | Hosono et al. |
| 6,925,009 B2 | 8/2005 | Noguchi et al. |
| 6,930,925 B2 | 8/2005 | Guo et al. |
| 6,934,188 B2 | 8/2005 | Roohparvar |
| 6,937,511 B2 | 8/2005 | Hsu et al. |
| 6,958,938 B2 | 10/2005 | Noguchi et al. |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 6,999,344 B2 | 2/2006 | Hosono et al. |
| 7,002,843 B2 | 2/2006 | Guterman et al. |
| 7,006,379 B2 | 2/2006 | Noguchi et al. |
| 7,012,835 B2 | 3/2006 | Gonzalez et al. |
| 7,020,017 B2 | 3/2006 | Chen et al. |
| 7,023,735 B2 | 4/2006 | Ban et al. |
| 7,031,210 B2 | 4/2006 | Park et al. |
| 7,031,214 B2 | 4/2006 | Tran |
| 7,031,216 B2 | 4/2006 | You |
| 7,039,846 B2 | 5/2006 | Hewitt et al. |
| 7,042,766 B1 | 5/2006 | Wang et al. |
| 7,054,193 B1 | 5/2006 | Wong |
| 7,054,199 B2 | 5/2006 | Lee et al. |
| 7,057,958 B2 | 6/2006 | So et al. |
| 7,065,147 B2 | 6/2006 | Ophir et al. |
| 7,068,539 B2 | 6/2006 | Guterman et al. |
| 7,071,849 B2 | 7/2006 | Zhang |
| 7,072,222 B2 | 7/2006 | Ishii et al. |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,145,805 B2 | 12/2006 | Ishii et al. |
| 7,151,692 B2 | 12/2006 | Wu |
| 7,158,058 B1 | 1/2007 | Yu |
| 7,170,781 B2 | 1/2007 | So et al. |
| 7,170,802 B2 | 1/2007 | Cernea et al. |
| 7,173,859 B2 | 2/2007 | Hemink |
| 7,177,184 B2 | 2/2007 | Chen |
| 7,177,195 B2 | 2/2007 | Gonzalez et al. |
| 7,177,199 B2 | 2/2007 | Chen et al. |
| 7,177,200 B2 | 2/2007 | Ronen et al. |
| 7,184,338 B2 | 2/2007 | Nakagawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,644 B1 | 3/2007 | Anderson et al. |
| 7,196,928 B2 | 3/2007 | Chen |
| 7,196,933 B2 | 3/2007 | Shibata |
| 7,197,594 B2 | 3/2007 | Raz et al. |
| 7,200,062 B2 | 4/2007 | Kinsely et al. |
| 7,210,077 B2 | 4/2007 | Brandenberger et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,254,763 B2 | 8/2007 | Aadsen et al. |
| 7,257,027 B2 | 8/2007 | Park |
| 7,259,987 B2 | 8/2007 | Chen et al. |
| 7,266,026 B2 | 9/2007 | Gongwer et al. |
| 7,266,069 B2 | 9/2007 | Chu |
| 7,269,066 B2 | 9/2007 | Nguyen et al. |
| 7,272,757 B2 | 9/2007 | Stocken |
| 7,274,611 B2 | 9/2007 | Roohparvar |
| 7,277,355 B2 | 10/2007 | Tanzawa |
| 7,280,398 B1 | 10/2007 | Lee et al. |
| 7,280,409 B2 | 10/2007 | Misumi et al. |
| 7,280,415 B2 | 10/2007 | Hwang et al. |
| 7,283,399 B2 | 10/2007 | Ishii et al. |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,269 B2 | 12/2007 | Shibata |
| 7,310,271 B2 | 12/2007 | Lee |
| 7,310,272 B1 | 12/2007 | Mokhlesi et al. |
| 7,310,347 B2 | 12/2007 | Lasser |
| 7,312,727 B1 | 12/2007 | Feng et al. |
| 7,321,509 B2 | 1/2008 | Chen et al. |
| 7,328,384 B1 | 2/2008 | Kulkarni et al. |
| 7,342,831 B2 | 3/2008 | Mokhlesi et al. |
| 7,343,330 B1 | 3/2008 | Boesjes et al. |
| 7,345,924 B2 | 3/2008 | Nguyen et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,365,671 B1 | 4/2008 | Anderson |
| 7,388,781 B2 | 6/2008 | Litsyn et al. |
| 7,397,697 B2 | 7/2008 | So et al. |
| 7,405,974 B2 | 7/2008 | Yaoi et al. |
| 7,405,979 B2 | 7/2008 | Ishii et al. |
| 7,408,804 B2 | 8/2008 | Hemink et al. |
| 7,408,810 B2 | 8/2008 | Aritome et al. |
| 7,409,473 B2 | 8/2008 | Conley et al. |
| 7,409,623 B2 | 8/2008 | Baker et al. |
| 7,420,847 B2 | 9/2008 | Li |
| 7,433,231 B2 | 10/2008 | Aritome |
| 7,433,697 B2 | 10/2008 | Karaoguz et al. |
| 7,434,111 B2 | 10/2008 | Sugiura et al. |
| 7,437,498 B2 | 10/2008 | Ronen |
| 7,440,324 B2 | 10/2008 | Mokhlesi |
| 7,440,331 B2 | 10/2008 | Hemink |
| 7,441,067 B2 | 10/2008 | Gorobets et al. |
| 7,447,970 B2 | 11/2008 | Wu et al. |
| 7,450,421 B2 | 11/2008 | Mokhlesi et al. |
| 7,453,737 B2 | 11/2008 | Ha |
| 7,457,163 B2 | 11/2008 | Hemink |
| 7,457,897 B1 | 11/2008 | Lee et al. |
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,907 B2 | 12/2008 | Kang et al. |
| 7,468,911 B2 | 12/2008 | Lutze et al. |
| 7,469,049 B1 | 12/2008 | Feng |
| 7,471,581 B2 | 12/2008 | Tran et al. |
| 7,483,319 B2 | 1/2009 | Brown |
| 7,487,329 B2 | 2/2009 | Hepkin et al. |
| 7,487,394 B2 | 2/2009 | Forhan et al. |
| 7,492,641 B2 | 2/2009 | Hosono et al. |
| 7,508,710 B2 | 3/2009 | Mokhlesi |
| 7,526,711 B2 | 4/2009 | Orio |
| 7,539,061 B2 | 5/2009 | Lee |
| 7,539,062 B2 | 5/2009 | Doyle |
| 7,551,492 B2 | 6/2009 | Kim |
| 7,558,109 B2 | 7/2009 | Brandman et al. |
| 7,558,839 B1 | 7/2009 | McGovern |
| 7,568,135 B2 | 7/2009 | Cornwell et al. |
| 7,570,520 B2 | 8/2009 | Kamei et al. |

| | | | | | |
|---|---|---|---|---|---|
| 7,574,555 B2 | 8/2009 | Porat et al. | 2005/0157555 A1 | 7/2005 | Ono et al. |
| 7,590,002 B2 | 9/2009 | Mokhlesi et al. | 2005/0162913 A1 | 7/2005 | Chen |
| 7,593,259 B2 | 9/2009 | Kim | 2005/0169051 A1 | 8/2005 | Khalid et al. |
| 7,594,093 B1 | 9/2009 | Kancherla | 2005/0189649 A1 | 9/2005 | Maruyama et al. |
| 7,596,707 B1 | 9/2009 | Vemula | 2005/0213393 A1 | 9/2005 | Lasser |
| 7,609,787 B2 | 10/2009 | Jahan et al. | 2005/0224853 A1 | 10/2005 | Ohkawa |
| 7,613,043 B2 | 11/2009 | Cornwell et al. | 2005/0240745 A1 | 10/2005 | Iyer et al. |
| 7,616,498 B2 | 11/2009 | Mokhlesi et al. | 2005/0243626 A1 | 11/2005 | Ronen |
| 7,619,918 B2 | 11/2009 | Aritome | 2006/0004952 A1 | 1/2006 | Lasser |
| 7,631,245 B2 | 12/2009 | Lasser | 2006/0028875 A1 | 2/2006 | Avraham et al. |
| 7,633,798 B2 | 12/2009 | Sarin et al. | 2006/0028877 A1 | 2/2006 | Meir |
| 7,633,802 B2 | 12/2009 | Mokhlesi | 2006/0101193 A1 | 5/2006 | Murin |
| 7,639,532 B2 | 12/2009 | Roohparvar et al. | 2006/0106972 A1 | 5/2006 | Gorobets et al. |
| 7,644,347 B2 | 1/2010 | Alexander et al. | 2006/0107136 A1 | 5/2006 | Gongwer et al. |
| 7,646,632 B2 * | 1/2010 | Philipp et al. ............... 365/163 | 2006/0129750 A1 | 6/2006 | Lee et al. |
| 7,656,734 B2 | 2/2010 | Thorp et al. | 2006/0133141 A1 | 6/2006 | Gorobets |
| 7,660,158 B2 | 2/2010 | Aritome | 2006/0156189 A1 | 7/2006 | Tomlin |
| 7,660,183 B2 | 2/2010 | Ware et al. | 2006/0179334 A1 | 8/2006 | Brittain et al. |
| 7,661,000 B2 | 2/2010 | Ueda et al. | 2006/0190699 A1 | 8/2006 | Lee |
| 7,661,054 B2 | 2/2010 | Huffman et al. | 2006/0203546 A1 | 9/2006 | Lasser |
| 7,665,007 B2 | 2/2010 | Yang et al. | 2006/0218359 A1 | 9/2006 | Sanders et al. |
| 7,680,987 B1 | 3/2010 | Clark et al. | 2006/0221692 A1 | 10/2006 | Chen |
| 7,733,712 B1 | 6/2010 | Walston et al. | 2006/0221705 A1 | 10/2006 | Hemink et al. |
| 7,742,351 B2 | 6/2010 | Inoue et al. | 2006/0221714 A1 | 10/2006 | Li et al. |
| 7,761,624 B2 | 7/2010 | Karamcheti et al. | 2006/0239077 A1 | 10/2006 | Park et al. |
| 7,797,609 B2 | 9/2010 | Neuman | 2006/0239081 A1 | 10/2006 | Roohparvar |
| 7,810,017 B2 | 10/2010 | Radke | 2006/0256620 A1 | 11/2006 | Nguyen et al. |
| 7,817,469 B2 * | 10/2010 | Avraham et al. ......... 365/185.09 | 2006/0256626 A1 | 11/2006 | Werner et al. |
| 7,830,708 B1 * | 11/2010 | Jung et al. ................ 365/185.03 | 2006/0256891 A1 | 11/2006 | Yuan et al. |
| 7,848,149 B2 | 12/2010 | Gonzales et al. | 2006/0271748 A1 | 11/2006 | Jain et al. |
| 7,864,593 B2 * | 1/2011 | Taeuber et al. ......... 365/185.24 | 2006/0285392 A1 | 12/2006 | Incarnati et al. |
| 7,869,273 B2 | 1/2011 | Lee et al. | 2006/0285396 A1 | 12/2006 | Ha |
| 7,885,119 B2 | 2/2011 | Li | 2007/0006013 A1 | 1/2007 | Moshayedi et al. |
| 7,904,783 B2 | 3/2011 | Brandman et al. | 2007/0019481 A1 | 1/2007 | Park |
| 7,924,613 B1 | 4/2011 | Sommer | 2007/0033581 A1 | 2/2007 | Tomlin et al. |
| 7,925,936 B1 | 4/2011 | Sommer | 2007/0047314 A1 | 3/2007 | Goda et al. |
| 7,928,497 B2 | 4/2011 | Yaegashi | 2007/0047326 A1 | 3/2007 | Nguyen et al. |
| 7,929,549 B1 | 4/2011 | Talbot | 2007/0050536 A1 | 3/2007 | Kolokowsky |
| 7,930,515 B2 | 4/2011 | Gupta et al. | 2007/0058446 A1 | 3/2007 | Hwang et al. |
| 7,945,825 B2 | 5/2011 | Cohen et al. | 2007/0061502 A1 | 3/2007 | Lasser et al. |
| 7,957,189 B2 * | 6/2011 | Avraham et al. ......... 365/185.09 | 2007/0067667 A1 | 3/2007 | Ikeuchi et al. |
| 7,975,189 B2 * | 7/2011 | Kose ............................ 714/704 | 2007/0074093 A1 | 3/2007 | Lasser |
| 7,978,516 B2 | 7/2011 | Olbrich et al. | 2007/0086239 A1 | 4/2007 | Litsyn et al. |
| 8,000,135 B1 * | 8/2011 | Perlmutter et al. ...... 365/185.03 | 2007/0086260 A1 | 4/2007 | Sinclair |
| 8,014,094 B1 | 9/2011 | Jin | 2007/0089034 A1 | 4/2007 | Litsyn et al. |
| 8,037,380 B2 | 10/2011 | Cagno et al. | 2007/0091677 A1 | 4/2007 | Lasser et al. |
| 8,040,744 B2 | 10/2011 | Gorobets et al. | 2007/0091694 A1 | 4/2007 | Lee et al. |
| 8,065,583 B2 | 11/2011 | Radke | 2007/0103978 A1 | 5/2007 | Conley et al. |
| 8,248,856 B2 * | 8/2012 | Goss et al. ................ 365/185.2 | 2007/0103986 A1 | 5/2007 | Chen |
| 8,250,437 B2 * | 8/2012 | Sakurada et al. ............. 714/764 | 2007/0104211 A1 | 5/2007 | Opsasnick |
| 2001/0002172 A1 | 5/2001 | Tanaka et al. | 2007/0109845 A1 | 5/2007 | Chen |
| 2001/0006479 A1 | 7/2001 | Ikehashi et al. | 2007/0109849 A1 | 5/2007 | Chen |
| 2002/0038440 A1 | 3/2002 | Barkan | 2007/0115726 A1 | 5/2007 | Cohen et al. |
| 2002/0056064 A1 | 5/2002 | Kidorf et al. | 2007/0118713 A1 | 5/2007 | Guterman et al. |
| 2002/0118574 A1 | 8/2002 | Gongwer et al. | 2007/0143378 A1 | 6/2007 | Gorobetz |
| 2002/0133684 A1 | 9/2002 | Anderson | 2007/0143531 A1 | 6/2007 | Atri |
| 2002/0166091 A1 | 11/2002 | Kidorf et al. | 2007/0159889 A1 | 7/2007 | Kang et al. |
| 2002/0174295 A1 | 11/2002 | Ulrich et al. | 2007/0159892 A1 | 7/2007 | Kang et al. |
| 2002/0196510 A1 | 12/2002 | Hietala et al. | 2007/0159907 A1 | 7/2007 | Kwak |
| 2003/0002348 A1 | 1/2003 | Chen et al. | 2007/0168837 A1 | 7/2007 | Murin |
| 2003/0103400 A1 | 6/2003 | Van Tran | 2007/0171714 A1 | 7/2007 | Wu et al. |
| 2003/0161183 A1 | 8/2003 | Van Tran | 2007/0183210 A1 | 8/2007 | Choi et al. |
| 2003/0189856 A1 | 10/2003 | Cho et al. | 2007/0189073 A1 | 8/2007 | Aritome |
| 2004/0057265 A1 | 3/2004 | Mirabel et al. | 2007/0195602 A1 | 8/2007 | Fong et al. |
| 2004/0057285 A1 | 3/2004 | Cernea et al. | 2007/0206426 A1 | 9/2007 | Mokhlesi |
| 2004/0083333 A1 | 4/2004 | Chang et al. | 2007/0208904 A1 | 9/2007 | Hsieh et al. |
| 2004/0083334 A1 | 4/2004 | Chang et al. | 2007/0226599 A1 | 9/2007 | Motwani |
| 2004/0105311 A1 | 6/2004 | Cernea et al. | 2007/0236990 A1 | 10/2007 | Aritome |
| 2004/0114437 A1 | 6/2004 | Li | 2007/0253249 A1 | 11/2007 | Kang et al. |
| 2004/0160842 A1 | 8/2004 | Fukiage | 2007/0256620 A1 | 11/2007 | Viggiano et al. |
| 2004/0223371 A1 | 11/2004 | Roohparvar | 2007/0263455 A1 | 11/2007 | Cornwell et al. |
| 2005/0007802 A1 | 1/2005 | Gerpheide | 2007/0266232 A1 | 11/2007 | Rodgers et al. |
| 2005/0013165 A1 | 1/2005 | Ban | 2007/0271424 A1 | 11/2007 | Lee et al. |
| 2005/0024941 A1 | 2/2005 | Lasser et al. | 2007/0280000 A1 | 12/2007 | Fujiu et al. |
| 2005/0024978 A1 | 2/2005 | Ronen | 2007/0291571 A1 | 12/2007 | Balasundaram |
| 2005/0030788 A1 | 2/2005 | Parkinson et al. | 2007/0297234 A1 | 12/2007 | Cernea et al. |
| 2005/0086574 A1 | 4/2005 | Fackenthal | 2008/0010395 A1 | 1/2008 | Mylly et al. |
| 2005/0121436 A1 | 6/2005 | Kamitani et al. | 2008/0025121 A1 | 1/2008 | Tanzawa |
| 2005/0144361 A1 | 6/2005 | Gonzalez et al. | 2008/0043535 A1 | 2/2008 | Roohparvar |

| | | | | | | |
|---|---|---|---|---|---|---|
| 2008/0049504 A1 | 2/2008 | Kasahara et al. | | 2010/0131827 A1 | 5/2010 | Sokolov et al. |
| 2008/0049506 A1 | 2/2008 | Guterman | | 2010/0142268 A1 | 6/2010 | Aritome |
| 2008/0052446 A1 | 2/2008 | Lasser et al. | | 2010/0142277 A1 | 6/2010 | Yang et al. |
| 2008/0055993 A1 | 3/2008 | Lee | | 2010/0157675 A1 | 6/2010 | Shalvi et al. |
| 2008/0080243 A1 | 4/2008 | Edahiro et al. | | 2010/0165689 A1 | 7/2010 | Rotbard et al. |
| 2008/0082730 A1 | 4/2008 | Kim et al. | | 2010/0169547 A1 | 7/2010 | Ou |
| 2008/0089123 A1 | 4/2008 | Chae et al. | | 2010/0169743 A1 | 7/2010 | Vogan et al. |
| 2008/0104309 A1 | 5/2008 | Cheon et al. | | 2010/0174847 A1 | 7/2010 | Paley et al. |
| 2008/0104312 A1 | 5/2008 | Lasser | | 2010/0195390 A1 | 8/2010 | Shalvi |
| 2008/0109590 A1 | 5/2008 | Jung et al. | | 2010/0199150 A1 | 8/2010 | Shalvi et al. |
| 2008/0115017 A1 | 5/2008 | Jacobson | | 2010/0211803 A1 | 8/2010 | Lablans |
| 2008/0123420 A1 | 5/2008 | Brandman et al. | | 2010/0220509 A1 | 9/2010 | Sokolov et al. |
| 2008/0123426 A1 | 5/2008 | Lutze et al. | | 2010/0220510 A1 | 9/2010 | Shalvi |
| 2008/0126686 A1 | 5/2008 | Sokolov et al. | | 2010/0250836 A1 | 9/2010 | Sokolov et al. |
| 2008/0130341 A1 | 6/2008 | Shalvi et al. | | 2010/0287217 A1 | 11/2010 | Borchers et al. |
| 2008/0148115 A1 | 6/2008 | Sokolov et al. | | 2011/0010489 A1 | 1/2011 | Yeh |
| 2008/0151618 A1 | 6/2008 | Sharon et al. | | 2011/0060969 A1 | 3/2011 | Ramamoorthy et al. |
| 2008/0151667 A1 | 6/2008 | Miu et al. | | 2011/0066793 A1 | 3/2011 | Burd |
| 2008/0158958 A1 | 7/2008 | Sokolov et al. | | 2011/0075482 A1 | 3/2011 | Shepard et al. |
| 2008/0181001 A1 | 7/2008 | Shalvi | | 2011/0107049 A1 | 5/2011 | Kwon et al. |
| 2008/0198650 A1 | 8/2008 | Shalvi et al. | | 2011/0149657 A1 | 6/2011 | Haratsch et al. |
| 2008/0198654 A1 | 8/2008 | Toda | | 2011/0199823 A1 | 8/2011 | Bar-Or et al. |
| 2008/0209116 A1 | 8/2008 | Caulkins | | 2011/0302354 A1 | 12/2011 | Miller |
| 2008/0209304 A1 | 8/2008 | Winarski et al. | | | | |
| 2008/0215798 A1 | 9/2008 | Sharon et al. | | FOREIGN PATENT DOCUMENTS | | |
| 2008/0219050 A1 | 9/2008 | Shalvi et al. | | | | |
| 2008/0239093 A1 | 10/2008 | Easwar et al. | | EP | 1605509 A1 | 12/2005 |
| 2008/0239812 A1 | 10/2008 | Abiko et al. | | WO | 9610256 A1 | 4/1996 |
| 2008/0253188 A1 | 10/2008 | Aritome | | WO | 9828745 A1 | 7/1998 |
| 2008/0253195 A1 * | 10/2008 | Kamata ............ 365/185.21 | | WO | 02100112 A1 | 12/2002 |
| 2008/0263262 A1 | 10/2008 | Sokolov et al. | | WO | 03100791 A1 | 12/2003 |
| 2008/0263676 A1 | 10/2008 | Mo et al. | | WO | 2007046084 A2 | 4/2007 |
| 2008/0270730 A1 | 10/2008 | Lasser et al. | | WO | 2007132452 A2 | 11/2007 |
| 2008/0282106 A1 | 11/2008 | Shalvi et al. | | WO | 2007132453 A2 | 11/2007 |
| 2008/0288714 A1 | 11/2008 | Salomon et al. | | WO | 2007132456 A2 | 11/2007 |
| 2009/0013233 A1 | 1/2009 | Radke | | WO | 2007132457 A2 | 11/2007 |
| 2009/0024905 A1 | 1/2009 | Shalvi et al. | | WO | 2007132458 A2 | 11/2007 |
| 2009/0034337 A1 | 2/2009 | Aritome | | WO | 2007146010 A2 | 12/2007 |
| 2009/0043831 A1 | 2/2009 | Antonopoulos et al. | | WO | 2008026203 A2 | 3/2008 |
| 2009/0043951 A1 | 2/2009 | Shalvi et al. | | WO | 2008053472 A2 | 5/2008 |
| 2009/0049234 A1 | 2/2009 | Oh et al. | | WO | 2008053473 A2 | 5/2008 |
| 2009/0073762 A1 | 3/2009 | Lee et al. | | WO | 2008068747 A2 | 6/2008 |
| 2009/0086542 A1 | 4/2009 | Lee et al. | | WO | 2008077284 A1 | 7/2008 |
| 2009/0089484 A1 | 4/2009 | Chu | | WO | 2008083131 A2 | 7/2008 |
| 2009/0091979 A1 | 4/2009 | Shalvi | | WO | 2008099958 A1 | 8/2008 |
| 2009/0094930 A1 | 4/2009 | Schwoerer | | WO | 2008111058 A2 | 9/2008 |
| 2009/0106485 A1 | 4/2009 | Anholt | | WO | 2008124760 A2 | 10/2008 |
| 2009/0112949 A1 | 4/2009 | Ergan et al. | | WO | 2008139441 A2 | 11/2008 |
| 2009/0132755 A1 | 5/2009 | Radke | | WO | 2009037691 A2 | 3/2009 |
| 2009/0144600 A1 | 6/2009 | Perlmutter et al. | | WO | 2009037697 A2 | 3/2009 |
| 2009/0150894 A1 | 6/2009 | Huang et al. | | WO | 2009038961 A2 | 3/2009 |
| 2009/0157950 A1 | 6/2009 | Selinger | | WO | 2009050703 A2 | 4/2009 |
| 2009/0157964 A1 | 6/2009 | Kasorla et al. | | WO | 2009053961 A2 | 4/2009 |
| 2009/0158126 A1 | 6/2009 | Perlmutter et al. | | WO | 2009053962 A2 | 4/2009 |
| 2009/0168524 A1 | 7/2009 | Golov et al. | | WO | 2009053963 A2 | 4/2009 |
| 2009/0172257 A1 | 7/2009 | Prins et al. | | WO | 2009063450 A2 | 5/2009 |
| 2009/0172261 A1 | 7/2009 | Prins et al. | | WO | 2009072100 A2 | 6/2009 |
| 2009/0193184 A1 | 7/2009 | Yu et al. | | WO | 2009072101 A2 | 6/2009 |
| 2009/0199074 A1 | 8/2009 | Sommer et al. | | WO | 2009072102 A2 | 6/2009 |
| 2009/0204824 A1 | 8/2009 | Lin et al. | | WO | 2009072103 A2 | 6/2009 |
| 2009/0204872 A1 | 8/2009 | Yu et al. | | WO | 2009072104 A2 | 6/2009 |
| 2009/0213653 A1 | 8/2009 | Perlmutter et al. | | WO | 2009072105 A2 | 6/2009 |
| 2009/0213654 A1 | 8/2009 | Perlmutter et al. | | WO | 2009074978 A2 | 6/2009 |
| 2009/0225595 A1 | 9/2009 | Kim | | WO | 2009074979 A2 | 6/2009 |
| 2009/0228761 A1 | 9/2009 | Perlmutter et al. | | WO | 2009078006 A2 | 6/2009 |
| 2009/0240872 A1 | 9/2009 | Perlmutter et al. | | WO | 2009095902 A2 | 8/2009 |
| 2009/0265509 A1 | 10/2009 | Klein | | WO | 2011024015 A1 | 3/2011 |
| 2009/0300227 A1 | 12/2009 | Nochimowski et al. | | | | |
| 2009/0323412 A1 | 12/2009 | Mokhlesi et al. | | OTHER PUBLICATIONS | | |
| 2009/0327608 A1 | 12/2009 | Eschmann | | | | |
| 2010/0017650 A1 | 1/2010 | Chin et al. | | Chinese Patent Application # 200780026181.3 Official Action dated Mar. 7, 2012. | | |
| 2010/0034022 A1 | 2/2010 | Dutta et al. | | | | |
| 2010/0057976 A1 | 3/2010 | Lasser | | Chinese Patent Application # 200780026094.8 Official Action dated Feb. 2, 2012. | | |
| 2010/0061151 A1 | 3/2010 | Miwa et al. | | | | |
| 2010/0082883 A1 | 4/2010 | Chen et al. | | U.S. Appl. No. 12/332,370 Official Action dated Mar. 8, 2012. | | |
| 2010/0083247 A1 | 4/2010 | Kanevsky et al. | | U.S. Appl. No. 12/579,432 Official Action dated Feb. 29, 2012. | | |
| 2010/0110580 A1 | 5/2010 | Takashima | | U.S. Appl. No. 12/522,175 Official Action dated Mar. 27, 2012. | | |
| 2010/0124088 A1 | 5/2010 | Shalvi et al. | | U.S. Appl. No. 12/607,085 Official Action dated Mar. 28, 2012. | | |
| 2010/0131697 A1 | 5/2010 | Alrod et al. | | | | |

Budilovsky et al., "Prototyping a High-Performance Low-Cost Solid-State Disk", SYSTOR—The 4th Annual International Systems and Storage Conference, Haifa, Israel, May 30-Jun. 1, 2011.

NVM Express Protocol, "NVM Express", Revision 1.0b, Jul. 12, 2011.

SCSI Protocol, "Information Technology—SCSI Architecture Model—5 (SAM-5)", INCITS document T10/2104-D, revision 01, Jan. 28, 2009.

SAS Protocol, "Information Technology—Serial Attached SCSI—2 (SAS-2)", INCITS document T10/1760-D, revision 15a, Feb. 22, 2009.

Agrell et al., "Closest Point Search in Lattices", IEEE Transactions on Information Theory, vol. 48, No. 8, pp. 2201-2214, Aug. 2002.

Ankolekar et al., "Multibit Error-Correction Methods for Latency-Constrained Flash Memory Systems", IEEE Transactions on Device and Materials Reliability, vol. 10, No. 1, pp. 33-39, Mar. 2010.

Berman et al., "Mitigating Inter-Cell Coupling Effects in MLC NAND Flash via Constrained Coding", Flash Memory Summit, Santa Clara, USA, Aug. 19, 2010.

Bez et al., "Introduction to Flash memory", Proceedings of the IEEE, vol. 91, No. 4, pp. 489-502, Apr. 2003.

Blahut, R.E., "Theory and Practice of Error Control Codes," Addison-Wesley, May 1984, section 3.2, pp. 47-48.

Chang, L., "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Compaq et al., "Universal Serial Bus Specification", revision 2.0, Apr. 27, 2000.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Eitan et al., "Multilevel Flash Cells and their Trade-Offs", Proceedings of the 1996 IEEE International Electron Devices Meeting (IEDM), pp. 169-172, New York, USA 1996.

Engh et al., "A self adaptive programming method with 5 mV accuracy for multi-level storage in FLASH", pp. 115-118, Proceedings of the IEEE 2002 Custom Integrated Circuits Conference, May 12-15, 2002.

Engineering Windows 7, "Support and Q&A for Solid-State Drives", e7blog, May 5, 2009.

Goodman et al., "On-Chip ECC for Multi-Level Random Access Memories," Proceedings of the IEEE/CAM Information Theory Workshop, Ithaca, USA, Jun. 25-29, 1989.

Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.

Hong et al., "NAND Flash-based Disk Cache Using SLC/MLC Combined Flash Memory", 2010 International Workshop on Storage Network Architecture and Parallel I/Os, pp. 21-30, USA, May 3, 2010.

Horstein, "On the Design of Signals for Sequential and Nonsequential Detection Systems with Feedback," IEEE Transactions on Information Theory IT-12:4 (Oct. 1966), pp. 448-455.

How to Resolve Bad Super Block: Magic Number Wrong in BSD, Free Online Articles Director ARTICLE BASE, posted Sep. 5, 2009.

Huffman, A., "Non-Volatile Memory Host Controller Interface (NVMHCI)", Specification 1.0, Apr. 14, 2008.

JEDEC Standard JESD84-C44, "Embedded MultiMediaCard (eMMC) Mechanical Standard, with Optional Reset Signal", Jedec Solid State Technology Association, USA, Jul. 2009.

Jedec, "UFS Specification", version 0.1, Nov. 11, 2009.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.

Kawaguchi et al. 1995. A flash-memory based file system. In Proceedings of the USENIX 1995 Technical Conference, New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 Mb/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

Micron Technology Inc., "Memory Management in NAND Flash Arrays", Technical Note, year 2005.

Numonyx, "M25PE16: 16-Mbit, page-erasable serial flash memory with byte-alterability, 75 MHz SPI bus, standard pinout", Apr. 2008.

Onfi, "Open NAND Flash Interface Specification," revision 1.0, Dec. 28, 2006.

Panchbhai et al., "Improving Reliability of NAND Based Flash Memory Using Hybrid SLC/MLC Device", Project Proposal for CSci 8980—Advanced Storage Systems, University of Minnesota, USA, Spring 2009.

Park et al., "Sub-Grouped Superblock Management for High-Performance Flash Storages", IEICE Electronics Express, vol. 6, No. 6, pp. 297-303, Mar. 25, 2009.

Phison Electronics Corporation, "PS8000 Controller Specification (for SD Card)", revision 1.2 Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

SD Group and SD Card Association, "SD Specifications Part 1 Physical Layer Specification", version 3.01, draft 1.00, Nov. 9, 2009.

Serial ATA International Organization, "Serial ATA Revision 3.0 Specification", Jun. 2, 2009.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Super User Forums, "SD Card Failure, can't read superblock", posted Aug. 8, 2010.

Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.

Takeuchi et al., "A Multipage Cell Architecture for High-Speed Programming Multilevel NAND Flash Memories", IEEE Journal of Solid State Circuits, vol. 33, No. 8, Aug. 1998.

UBUNTU Forums, "Memory Stick Failed IO Superblock", posted Nov. 11, 2009.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Search Report dated May 30, 2008.

International Application PCT/IL2007/000576 Search Report dated Jul. 7, 2008.

International Application PCT/IL2007/000579 Search report dated Jul. 3, 2008.

International Application PCT/IL2007/000580 Search Report dated Sep. 11, 2008.

International Application PCT/IL2007/000581 Search Report dated Aug. 25, 2008.

International Application PCT/IL2007/001059 Search report dated Aug. 7, 2008.

International Application PCT/IL2007/001315 search report dated Aug. 7, 2008.

International Application PCT/IL2007/001316 Search report dated Jul. 22, 2008.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan. 28, 2009.

International Application PCT/IL2008/001356 Search Report dated Feb. 3, 2009.

International Application PCT/IL2008/001446 Search report dated Feb. 20, 2009.

U.S. Appl. No. 11/949,135 Official Action dated Oct. 2, 2009.
U.S. Appl. No. 12/019,011 Official Action dated Nov. 20, 2009.
U.S. Appl. No. 11/957,970 Official Action dated May 20, 2010.
U.S. Appl. No. 12/171,797 Official Action dated Aug. 25, 2010.
U.S. Appl. No. 11/945,575 Official Action dated Aug. 24, 2010.
U.S. Appl. No. 12/497,707 Official Action dated Sep. 15, 2010.
U.S. Appl. No. 11/995,801 Official Action dated Oct. 15, 2010.
U.S. Appl. No. 12/045,520 Official Action dated Nov. 16, 2010.
U.S. Appl. No. 12/388,528 Official Action dated Nov. 29, 2010.
U.S. Appl. No. 11/995,814 Official Action dated Dec. 17, 2010.
U.S. Appl. No. 12/251,471 Official Action dated Jan. 3, 2011.
U.S. Appl. No. 12/534,898 Official Action dated Mar. 23, 2011.
Chinese Application # 200780026181.3 Official Action dated Apr. 8, 2011.
U.S. Appl. No. 12/178,318 Official Action dated May 31, 2011.
U.S. Appl. No. 11/995,813 Official Action dated Jun. 16, 2011.
U.S. Appl. No. 12/344,233 Official Action dated Jun. 24, 2011.
U.S. Appl. No. 12/251,471, filed Oct. 15, 2008.
U.S. Appl. No. 12/534,893, filed Aug. 4, 2009.
U.S. Appl. No. 12/534,898, filed Aug. 4, 2009.
U.S. Appl. No. 12/551,583, filed Sep. 1, 2009.
U.S. Appl. No. 12/551,567, filed Sep. 1, 2009.
U.S. Appl. No. 12/558,528, filed Sep. 13, 2009.
U.S. Appl. No. 12/579,430, filed Oct. 15, 2009.
U.S. Appl. No. 12/579,432, filed Oct. 15, 2009.
U.S. Appl. No. 12/607,078, filed Oct. 28, 2009.
U.S. Appl. No. 12/607,085, filed Oct. 28, 2009.
U.S. Appl. No. 12/649,358, filed Dec. 30, 2009.
U.S. Appl. No. 12/649,360, filed Dec. 30, 2009.
U.S. Appl. No. 12/688,883, filed Jan. 17, 2010.
U.S. Appl. No. 12/728,296, filed Mar. 22, 2010.
U.S. Appl. No. 12/758,003, filed Apr. 11, 2010.
U.S. Appl. No. 12/880,101, filed Sep. 12, 2010.
U.S. Appl. No. 12/890,724, filed Sep. 27, 2010.
U.S. Appl. No. 12/822,207, filed Jun. 24, 2010.
U.S. Appl. No. 12/987,174, filed Jan. 10, 2011.
U.S. Appl. No. 12/987,175, filed Jan. 10, 2011.
U.S. Appl. No. 12/963,649, filed Dec. 9, 2010.
U.S. Appl. No. 13/021,754, filed Feb. 6, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
U.S. Appl. No. 13/114,049, filed May 24, 2011.
U.S. Appl. No. 13/171,467, filed Jun. 29, 2011.
U.S. Appl. No. 13/176,761, filed Jul. 6, 2011.

Wei, L., "Trellis-Coded Modulation With Multidimensional Constellations", IEEE Transactions on Information Theory, vol. IT-33, No. 4, pp. 483-501, Jul. 1987.

U.S. Appl. No. 13/114,049 Official Action dated Sep. 12, 2011.
U.S. Appl. No. 12/405,275 Official Action dated Jul. 29, 2011.

Conway et al., "Sphere Packings, Lattices and Groups", 3rd edition, chapter 4, pp. 94-135, Springer, New York, USA 1998.

Chinese Patent Application # 200780040493.X Official Action dated Jun. 15, 2011.

U.S. Appl. No. 12/037,487 Official Action dated Oct. 3, 2011.
U.S. Appl. No. 12/649,360 Official Action dated Aug. 9, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
U.S. Appl. No. 13/214,257, filed Aug. 22, 2011.
U.S. Appl. No. 13/192,501, filed Jul. 28, 2011.
U.S. Appl. No. 13/192,495, filed Jul. 28, 2011.
U.S. Appl. No. 12/323,544 Office Action dated Dec. 13, 2011.
U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.
U.S. Appl. No. 13/355,536, filed Jan. 22, 2012.

Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.

US 7,161,836, 01/2007, Wan et al. (withdrawn)

* cited by examiner

ESTIMATION OF MEMORY CELL READ THRESHOLDS BY SAMPLING INSIDE PROGRAMMING LEVEL DISTRIBUTION INTERVALS

CROSS-REFERENCE TO RELATED APPLICATIONS

This application is a continuation-in-part of U.S. patent application Ser. No. 12/558,528, filed Sep. 13, 2009, which claims the benefit of U.S. Provisional Patent Application 61/096,806, filed Sep. 14, 2008. The disclosures of these related applications are incorporated herein by reference.

FIELD OF THE INVENTION

The present invention relates generally to memory devices, and particularly to methods and systems for setting read thresholds in analog memory cell devices.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

Analog memory cells are typically read by comparing their analog values (storage values) to one or more read thresholds. Several methods for determining read threshold values are known in the art. For example, U.S. Patent Application Publication 2005/0013165, whose disclosure is incorporated herein by reference, describes methods for reading cells of a Flash memory. The cells are read by determining respective adaptive reference voltages for the cells and comparing the cells' threshold voltages to their respective reference voltages. The adaptive reference voltages are determined either from analog measurements of the threshold voltages of the cells' neighbors, or from preliminary estimates of the cells' threshold voltages based on comparisons of the cells' threshold voltages with integral or fractional reference voltages common to all the cells. Cells of a Flash memory are also read by comparing the cells' threshold voltages to integral reference voltages, comparing the threshold voltages of cells that share a common bit pattern to a fractional reference voltage, and adjusting the reference voltages in accordance with the comparisons.

U.S. Patent Application Publication 2006/0028875, whose disclosure is incorporated herein by reference, describes methods for managing a plurality of memory cells. The cells are managed by obtaining values of one or more environmental parameters of the cells and adjusting values of one or more reference voltages of the cells accordingly. Alternatively, a statistic of at least some of the cells, relative to a single reference parameter that corresponds to a control parameter of the cells, is measured, and the value of the reference voltage is adjusted accordingly.

U.S. Pat. No. 5,657,332, whose disclosure is incorporated herein by reference, describes methods for recovering from hard errors in a solid-state memory system. A memory system includes an array of memory cells, each cell capable of having its threshold voltage programmed or erased to an intended level. An error checking scheme is provided for each of a plurality of groups of cells for identifying read errors therein. A read reference level is adjusted before each read operation on the individual group of cells containing read errors, each time the read reference level being displaced a predetermined step from a reference level for normal read, until the error checking means no longer indicates read errors. The drifted threshold voltage of each cell associated with a read error is re-written to its intended level.

U.S. Pat. No. 7,023,735, whose disclosure is incorporated herein by reference, describes methods for reading Flash memory cells, which, in addition to comparing the threshold voltages of Flash cells to integral reference voltages, compare the threshold voltages to fractional reference voltages.

U.S. Patent Application Publication 2007/0091677, whose disclosure is incorporated herein by reference, describes methods, devices and computer readable code for reading data from one or more flash memory cells, and for recovering from read errors. In some embodiments, in the event of an error correction failure by an error detection and correction module, the flash memory cells are re-read at least once using one or more modified reference voltages, until successful error correction may be carried out.

U.S. Pat. No. 6,963,505, whose disclosure is incorporated herein by reference, describes a method, circuit and system for determining a reference voltage. In some embodiments a set of operating reference cells is established to be used in operating cells in a Non-Volatile Memory (NVM) block or array. At least a subset of cells of the NVM block or array may be read using each of two or more sets of test reference cells, where each set of test reference cells may generate or otherwise provide reference voltages at least slightly offset from each other set of test reference cells. For each set of test reference cells used to read at least a subset of the NVM block, a read error rate may be calculated or otherwise determined. A set of test reference cells associated with a relatively low read error rate may be selected as the set of operating reference cells to be used in operating other cells, outside the subset of cells, in the NVM block or array.

SUMMARY OF THE INVENTION

An embodiment of the present invention that is described herein provides a method for data storage. The method includes storing data in a group of analog memory cells by writing into the memory cells in the group respective storage values, which program each of the analog memory cells to a respective programming state selected from a predefined set of programming states, including at least first and second programming states, which are applied respectively to first and second subsets of the memory cells, whereby the storage values held in the memory cells in the first and second subsets are distributed in accordance with respective first and second distributions. A first median of the first distribution is estimated, and a read threshold, which differentiates between the first and second programming states, is calculated based on the estimated first median. The data is retrieved from the analog memory cells in the group by reading the storage values using the calculated read threshold.

In some embodiments, the storage values corresponding to the first programming state lie in a given interval, and estimating the first median includes reading at least some of the storage values using one or more intermediate read thresholds, which are positioned in an interior of the given interval, and assessing the first median responsively to the storage values read using the intermediate read thresholds.

In an embodiment, estimating the first median includes holding an estimated Cumulative Distribution Function (CDF) of the first distribution, and assessing the first median responsively to the storage values read using the intermediate read thresholds and to the estimated CDF. Estimating the first median may include assessing the first median responsively to the estimated CDF and to the storage values read using only a single intermediate read threshold. In a disclosed embodiment, holding the estimated CDF includes holding multiple estimated CDFs, and assessing the first median includes selecting one of the multiple CDFs in accordance with a predefined criterion, and assessing the first median using the selected estimated CDF.

In another embodiment, reading the storage values using the intermediate read thresholds includes counting the storage values falling on a given side of a given one of the intermediate read thresholds, and assessing the first median includes computing the first median based on the counted storage values. In an embodiment, counting the storage values includes incrementing one or more hardware-based counters. In yet another embodiment, reading the storage values using the intermediate read thresholds includes reading the storage values from only a partial subset of the memory cells in the group. In still another embodiment, reading the storage values using the intermediate read thresholds includes reading the storage values using two or more intermediate read thresholds in a single multi-threshold read command.

In some embodiment, estimation of the first median and calculation of the read threshold are invoked responsively to a failure to successfully retrieve the data. In an embodiment, the method further includes calculating a second median of the second distribution, and calculating the read threshold includes estimating the read threshold based on the first and second medians. Estimating the read threshold may include calculating a first estimate of the read threshold based on the first median, calculating a second estimate of the read threshold based on the second median, and combining the first and second estimates. In an embodiment, estimating the first and second medians includes holding predefined nominal values of the first and second medians, and assessing the first and second medians responsively to the nominal values.

There is additionally provided, in accordance with an embodiment of the present invention, apparatus for data storage including an interface and circuitry. The interface is coupled to communicate with a memory that includes multiple analog memory cells. The circuitry is configured to store data in a group of the analog memory cells by writing into the memory cells in the group respective storage values, which program each of the analog memory cells to a respective programming state selected from a predefined set of programming states, including at least first and second programming states, which are applied respectively to first and second subsets of the memory cells, whereby the storage values held in the memory cells in the first and second subsets are distributed in accordance with respective first and second distributions, to estimate a first median of the first distribution, to calculate a read threshold, which differentiates between the first and second programming states, based on the estimated first median, and to retrieve the data from the analog memory cells in the group by reading the storage values using the calculated read threshold.

There is also provided, in accordance with an embodiment of the present invention, apparatus for data storage including a memory and circuitry. The memory includes multiple analog memory cells. The circuitry is configured to store data in a group of the analog memory cells by writing into the memory cells in the group respective storage values, which program each of the analog memory cells to a respective programming state selected from a predefined set of programming states, including at least first and second programming states, which are applied respectively to first and second subsets of the memory cells, whereby the storage values held in the memory cells in the first and second subsets are distributed in accordance with respective first and second distributions, to estimate a first median of the first distribution, to calculate a read threshold, which differentiates between the first and second programming states, based on the estimated first median, and to retrieve the data from the analog memory cells in the group by reading the storage values using the calculated read threshold.

The present invention will be more fully understood from the following detailed description of the embodiments thereof, taken together with the drawings in which:

DETAILED DESCRIPTION OF EMBODIMENTS

Overview

A typical analog memory device stores data by writing respective storage values into a group of analog memory cells. The storage process programs each memory cell to a respective programming level (also referred to as a programming state), which is selected from a predefined set of programming levels. Due to various impairments, the storage values associated with each programming level are not uniform, but rather are distributed in accordance with a certain statistical distribution. This distribution is commonly referred to as a programming level distribution. Data is typically read from the memory cells by comparing the storage values of the cells to one or more read thresholds, which are usually positioned between adjacent programming level distributions. An optimal read threshold between two adjacent programming level distributions is a threshold value that minimizes the number of read errors, or equivalently, maximizes the number of cells whose storage values are read out correctly. Since programming level distributions may vary over time and/or from one cell group to another, and adjacent programming level distributions may overlap at their edges, the optimal positions of read threshold often vary, as well.

Embodiments of the present invention that are described hereinbelow provide improved methods and systems for setting and adjusting read thresholds used in data readout from analog memory cells. In some embodiments, a Memory Signal Processor (MSP) or other memory controller calculates a read threshold that is used for differentiating between two programming levels by (1) estimating the statistical median of at least one of the programming level distributions, and (2) estimating the optimal read threshold position based on the median or medians.

The median of a given programming level distribution is typically estimated by reading at least some of the memory cells using one or more intermediate read thresholds. The intermediate read thresholds are positioned in the interior of the programming level distribution, rather than at the edge of the distribution or between adjacent distributions. Each read operation using an intermediate read threshold indicates the number of storage values falling on either side of the intermediate threshold, and is therefore indicative of the location of the median. Several methods for estimating the distribution median using intermediate read thresholds are described herein.

The intermediate read thresholds are positioned in the interiors of the programming level distributions and not between distributions or at the distribution edges. At these threshold positions, the Cumulative Distribution Function (CDF) of the cell storage values is relatively steep, i.e., has a relatively high derivative. As a result, the read operations using these thresholds are highly accurate in estimating the distribution medians. Consequently, the read threshold calculation processes described herein are highly accurate and reliable, even when based on a small number of read operations.

System Description

Figure 1:
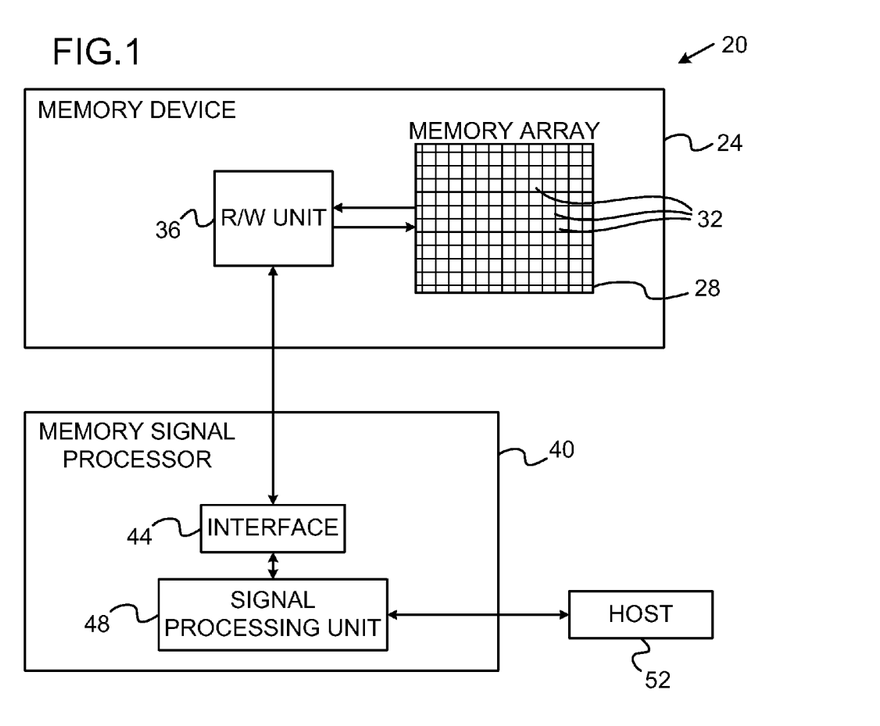
FIG. 1 is a block diagram that schematically illustrates a memory system, in accordance with an embodiment of the present invention.

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 32 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In particular, unit sets and adjusts read thresholds that are used for reading data from memory cells 32, using methods that are described below.

In some embodiments, unit 48 encodes the data for storage using a suitable Error Correction Code (ECC) and decodes the ECC of data retrieved from the memory. In some embodiments, unit 48 produces the storage values for storing in the memory cells and provides these values to R/W unit 36. Alternatively, unit 48 provides the data for storage, and the conversion to storage values is carried out by the R/W unit internally to the memory device. Alternatively to using an MSP, the methods described herein can be carried out by any suitable type of memory controller.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and the MSP may be integrated on separate semiconductor dies in a single Multi-Chip Package (MCP) or System on Chip (SoC), and may be interconnected by an internal bus. Further alternatively, some or all of the MSP circuitry may reside on the same die on which the memory array is disposed. Further alternatively, some or all of the functionality of MSP 40 can be implemented in software and carried out by a processor or other element of the host system. In some embodiments, host 44 and MSP 40 may be fabricated on the same die, or on separate dies in the same device package.

In some embodiments, MSP 40 (or other memory controller that carries out the methods described herein) comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Typical memory devices may comprise several thousand erasure blocks. In a typical two-bit-per-cell MLC device, each erasure block is on the order of 32 word lines, each comprising several thousand cells. Each word line of such a device is often partitioned into four pages (odd/even order cells, least/most significant bit of the cells). Three-bit-per-cell devices having 32 word lines per erasure block would have 192 pages per erasure block, and four-bit-per-cell devices would have 256 pages per block. Alternatively, other block sizes and configurations can also be used.

Some memory devices comprise two or more separate memory cell arrays, often referred to as planes. Since each plane has a certain "busy" period between successive write operations, data can be written alternately to the different planes in order to increase programming speed.

Threshold Voltage Distributions

Analog memory cells are programmed to store data by writing storage values into the cells. Although the programming operation attempts to write nominal storage values that represent the data, the actual storage values found in the cells at the time of readout may deviate from these nominal values. The deviations may be caused by several factors, such as inaccuracies in the programming process, drift due to device aging, cell wearing due to previous programming and erasure cycles, disturb noise caused by memory operations applied to other cells in the array and/or cross-coupling interference from other cells. In practice, the storage values of the cells typically have a certain statistical distribution, which may vary from one cell group to another and/or over the lifetime of the memory cells.

(Although the description that follows refers mainly to threshold voltages of Flash memory cells, this choice is made purely for the sake of conceptual clarity. The methods and systems described herein can be used with any other type of storage value used in any other type of analog memory cells.)

Figure 2:
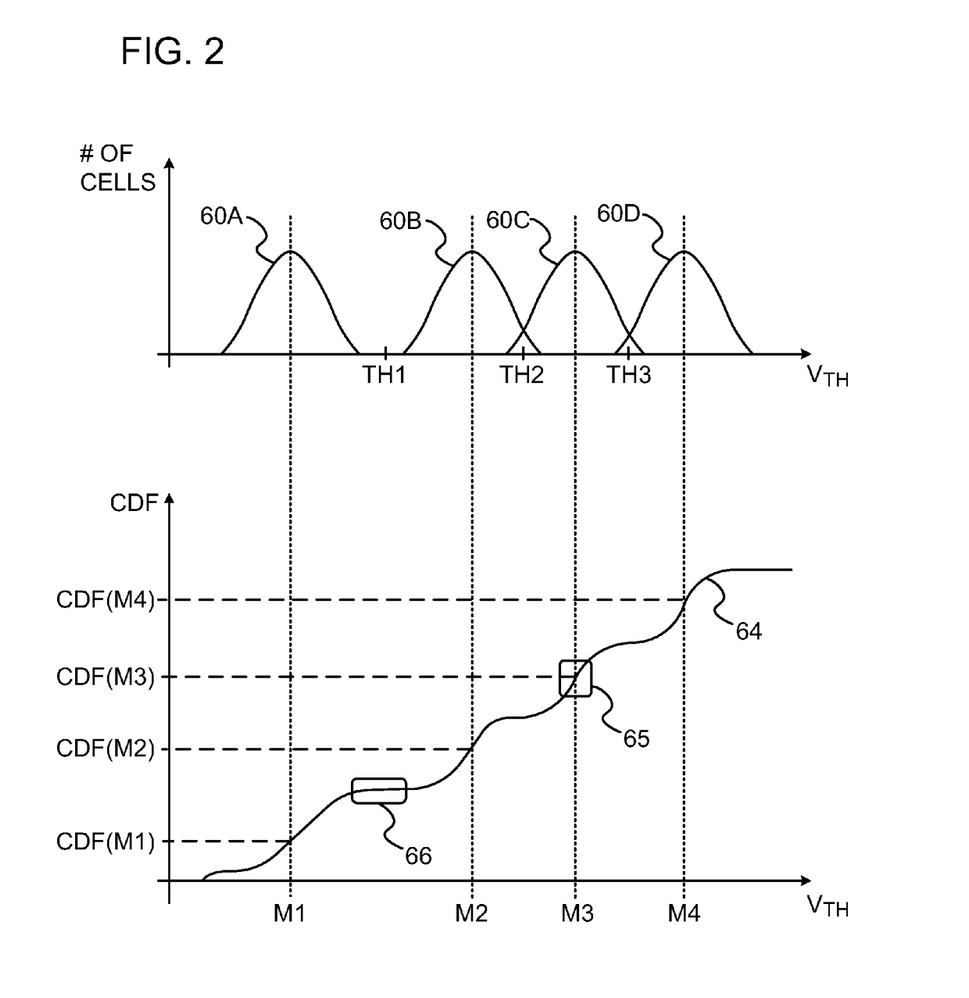
FIG. 2 is a graph showing threshold voltage distributions in a group of analog memory cells, in accordance with an embodiment of the present invention.

FIG. 2 is a graph showing a distribution (upper plot) and a Cumulative Density Function (CDF, lower plot) of threshold voltages ($V_{TH}$) in a group of analog memory cells, in accordance with an embodiment of the present invention. The cell group may comprise, for example, memory cells belonging to a given memory page or word line.

In the present example, the memory cells comprise four-level MLC, with each cell storing two data bits. Curves 60A ... 60D show the distributions of threshold voltages in the group of cells. Each curve corresponds to a subset of the cells that are programmed to a certain programming level or state. Thus, distributions 60A ... 60D are also referred to as programming level distributions. Distributions 60A ... 60D have respective median values denoted M1 ... M4. In order to read the data from the memory cells, R/W unit 36 compares the storage values of the cells with one or more read thresholds. In the present example, three read thresholds TH1 ... TH3 are used to differentiate between the four programming levels.

A curve 64 shows the Cumulative Distribution Function (CDF) of the threshold voltages in the group of cells. For a given threshold voltage on the horizontal axis, the CDF gives the relative number of cells whose threshold voltage does not exceed the given threshold voltage. In other words, CDF(x) gives the relative number of memory cells in the group, for which $V_{TH} \leq x$. Thus, the CDF is zero at the lower edge of the voltage axis, and increases monotonically to reach a value of unity at the upper edge of the voltage axis. Distributions 60A ... 60D are sometimes referred to as Probability Density Functions (PDFs) of the programming levels, and the CDF can be regarded as the integral of the PDFs along the $V_{TH}$ axis.

Two regions 65 and 66 are marked on curve 64, in order to demonstrate the advantage of performing read operations using intermediate read thresholds that are positioned inside the programming level distributions. Region 65 is in the vicinity of the median of one of the programming level distribution (in the vicinity of median M3 of distribution 60C). Region 66, on the other hand, is in the boundary region between adjacent distributions (between distributions 60A and 60B. As can be appreciated, the CDF (curve 64) is relatively steep in region 65, and relatively flat in region 66. For a given reading accuracy, a steeper CDF enables higher accuracy in estimating CDF properties, such as distribution medians.

Setting Read Thresholds Using Distribution Medians

Embodiments of the present invention provide improved methods and systems for setting and adjusting the positions of read thresholds, e.g., thresholds TH1 . . . TH3 in FIG. 2. The methods and systems described herein, however, are in no way limited to any specific type of memory cells or a specific number of programming levels. The disclosed techniques can be used to calculate and set read thresholds in any suitable type of analog memory cells having any desired number and arrangement of programming levels. Specifically, these techniques are applicable to SLC as well as MLC configurations.

For a given read threshold used in differentiating between adjacent programming levels, the optimal threshold position is typically in the boundary region that separates the two programming levels. The location of this boundary region (and therefore the optimal read threshold position) may change over time, as explained above. The techniques described herein estimate the distribution medians, and then find the optimal read threshold position using the estimated medians.

Figure 3:
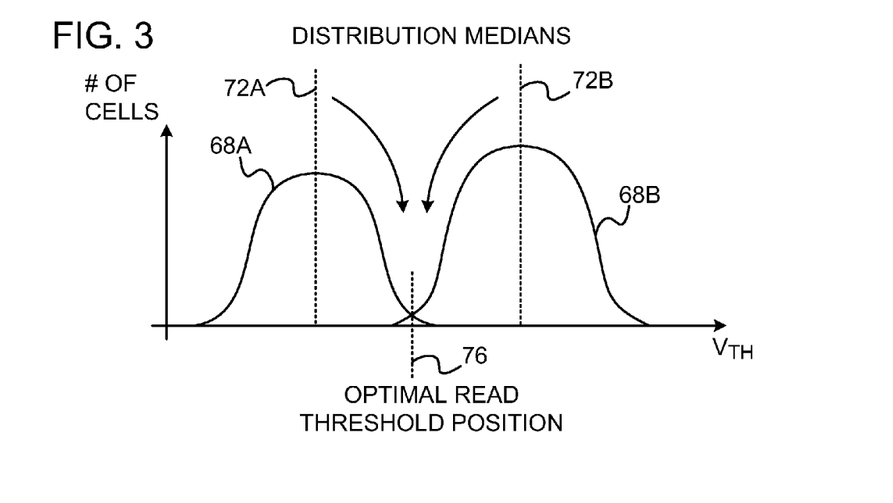
FIG. 3 is a diagram that schematically illustrates a process for setting a read threshold, in accordance with an embodiment of the present invention.

FIG. 3 is a diagram that schematically illustrates a process for setting a read threshold, in accordance with an embodiment of the present invention. The figure shows two threshold voltage distributions 68A and 68B, each corresponding to a respective programming level. In some embodiments, MSP 40 estimates the position of a read threshold 76 by estimating respective medians 72A and 72B of distributions 68A and 68B, and then calculating the read threshold position using the two medians.

The median of a statistical distribution is commonly known as a value that is higher than half of the population and lower than the other half of the population. The median of a given threshold voltage distribution is a (not necessarily unique) threshold voltage that is lower than half of the threshold voltages in the distribution, and higher than the other half. In the context of the present patent application and in the claims, the term "estimating a median" is used broadly to describe various calculations that provide information as to the median. For example, processes that estimate the distribution mean, as well as processes that estimate the peak (highest value) of the distribution's Probability Density Function (PDF), are also regarded as types of median estimation.

Thus, in the context of the present patent application and in the claims, the term "median" also covers other central values or measures of central tendency of the distribution, such as the distribution mean (arithmetic, weighted, geometric or any other type of mean), the peak of the distribution PDF (sometimes referred to as the mode of the distribution), or any other suitable measure. Typically, the disclosed techniques do not require that the median be estimated with high accuracy, and rough estimation is often sufficient for determining the optimal read threshold positions.

MSP 40 may estimate the median of a given threshold voltage distribution in various ways. Typically, the MSP finds the median by performing one or more read operations using intermediate read thresholds, which are positioned in the interior of the distribution (rather than in the boundary region between the distributions or at the distribution edges). Each read operation of this sort compares the cell threshold voltages to a given intermediate read threshold. The MSP or R/W unit may count the number of storage values that are below (or above) the intermediate read threshold.

If the intermediate read threshold were positioned at the distribution median, the read operation would indicate that 50% of the read threshold voltages are below the intermediate threshold and 50% are above it. A read result that deviates from 50% indicates that the intermediate threshold is offset from the median. The MSP may estimate the offset and thus determine the median value. In some embodiments, the functional behavior or shape of the CDF or PDF may be known a-priori, and only its position on the $V_{TH}$ axis is unknown. For example, the cell threshold voltages in a given programming level may be distributed according to a Gaussian distribution having a known variance. Alternatively, the MSP may store an estimated CDF, e.g., in numerical or analytical form. When the CDF shape is known, the MSP can calculate the distribution median using (1) the read results of a single read operation using an intermediate read threshold, and (2) the known shape of the CDF.

(In the present context, the term "estimated CDF" refers to any representation that is indicative of the estimated statistical distribution of the cell threshold voltages, such as CDF, inverse CDF, PDF, histogram or any other suitable representation.)

Alternatively, the MSP may perform two or more read operations, using different intermediate read thresholds that are placed at different positions within the threshold voltage distribution in question. Each read operation produces an additional data point of the programming level CDF. The MSP may thus estimate the distribution median using the results of the multiple read operations. Any suitable number of read operations can be used. A large number of read operations increases the estimation accuracy at the expense of higher computational complexity, and vice versa.

In the embodiments described herein, each intermediate read threshold is placed in the interior of the threshold voltage distribution in question, rather than between distributions. In other words, the threshold voltages of a given programming level distribution may be regarded as occupying a certain interval. The intermediate read thresholds, which are used for estimating the median of that distribution, are positioned in the interior of the interval. In the context of the present patent application and in the claims, the term "interior" is used to describe any position that contains a statistically-significant level of the distribution PDF, as opposed to interval edges. The interior of the interval may be defined, for example, as the positions that are distant from the distribution medians by less than a certain amount. This amount may be quantified, for example, in units of cell number or CDF value. The interior may also be defined as the positions that are within one standard deviation of the distribution mean or median, the positions for which the distribution PDF is larger than a certain value (e.g., 50% of the PDF peak), or using any other suitable definition.

MSP 40 may apply various methods for calculating the optimal read threshold based on the estimated medians. For example, the MSP may calculate the read threshold position based on each estimated median separately, and then combine (e.g., average) the two results. When calculating the average, the MSP may give different weights to the two medians, according to any suitable criterion. Alternatively, the MSP may apply any other suitable method for calculating the optimal read threshold based on the estimated medians.

Figure 4:
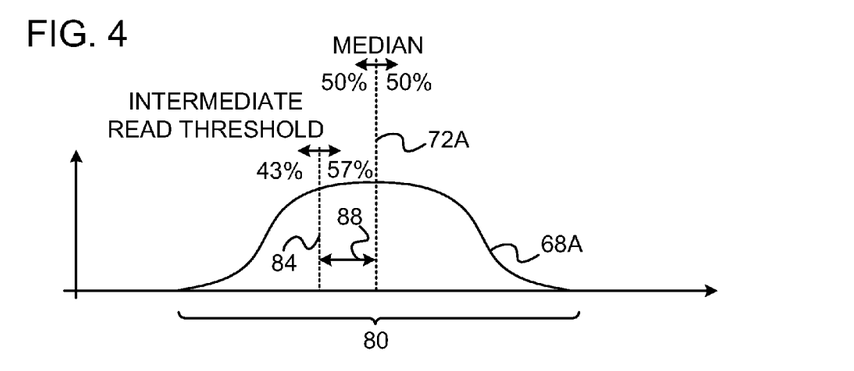
FIG. 4 is a diagram that schematically illustrates a process for estimating the median of a threshold voltage distribution, in accordance with an embodiment of the present invention.

FIG. 4 is a diagram that schematically illustrates a process for estimating the median of a threshold voltage distribution, in accordance with an embodiment of the present invention.

FIG. 4 shows a process of estimating median 72A of threshold voltage distribution 68A. In the present example, the threshold voltages of distribution 68A lie in an interval 80. In order to estimate the distribution median, the MSP initially reads the memory cells using an intermediate threshold 84, which is positioned in the interior of the interval.

The read operation indicates that 43% of the memory cells have threshold voltages that are lower than intermediate threshold 84, and 57% of the memory cells have threshold voltages that are higher than the intermediate threshold. Based on this result (and assuming that the shape of distribution 68A is known) the MSP can estimate an offset 88 between intermediate threshold 84 and media 72A, and thus estimate the median.

Alternatively, as noted above, the MSP may perform two or more read operations, using different intermediate thresholds in the interior of interval 80, and estimate median 72A using the results of these multiple read operations. This technique can be used, for example, when the shape of distribution 68A in unknown a-priori or when the actual CDF differs from the estimated (reference) CDF. Consider, for example, a scenario in which the estimated CDF represents wider programming level distributions than the actual CDF. In such a case, reading the memory cells using two intermediate read thresholds, one on either side of the reference CDF's median. This kind of two-sided estimation would detect and correct the difference between the actual and estimated CDFs, resulting in accurate median estimation.

In some embodiments, system 20 may comprise one or more hardware-based counters, which are incremented so as to count the number of memory cells whose threshold voltages fall on either side of the read threshold. The counters may be part of MSP 40 or of R/W unit 36 in the memory device.

Figure 5:
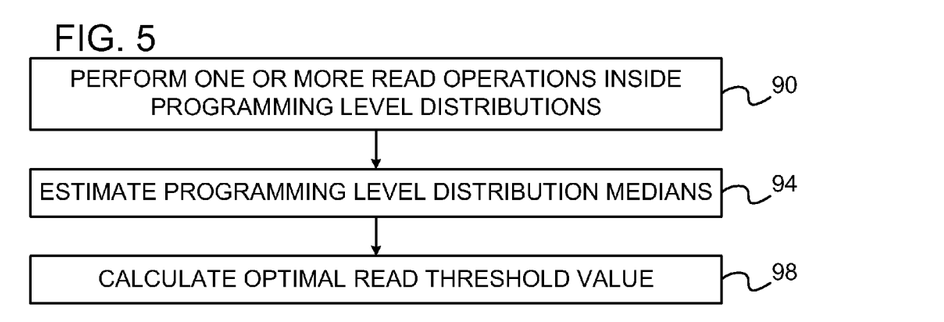
FIG. 5 is a flow chart that schematically illustrates a method for setting a read threshold, in accordance with an embodiment of the present invention.

FIG. 5 is a flow chart that schematically illustrates a method for setting a read threshold for reading a group of analog memory cells, in accordance with an embodiment of the present invention. The method begins with MSP 40 instructing R/W unit 36 to read the memory cells in the group using intermediate read thresholds, at an intermediate reading step 90. The MSP positions the intermediate thresholds in the interiors of the threshold voltage distributions. Using the results of the intermediate read operations, the MSP estimates the medians of the threshold voltage distributions, at a media estimation step 94. Based on the estimated medians, the MSP calculates the optimal position of the read threshold used for data readout from the cell group, at a threshold calculation step 98. When reading data from the cell group in question, the MSP sets the read threshold to the position calculated at step 98 above, and reads the threshold voltages of the cells using this read threshold.

The description of FIGS. 3-5 refers to a single read threshold that differentiates between two adjacent programming levels. These embodiments, however, are chosen purely for the sake of conceptual clarity. In alternative embodiments, the techniques described herein can be used to estimate any desired number of read thresholds for differentiating between any desired number of programming levels.

Additional Embodiments and Examples

In the embodiments described above, the read threshold position is estimated based on the medians of two adjacent programming level distributions, one on either side of the read threshold. In alternative embodiments, the MSP may estimate the read threshold position based on a single median of a single programming level distribution. In an example embodiment of this sort, the MSP reads a certain group of memory cells using one or more intermediate read thresholds that are positioned in the interior of a single programming level distribution, as explained above. Using the results of these read operations, the MSP estimates the median of the programming level distribution. Based on the median (e.g., using the known shape of the distribution) the MSP estimates the optimal position of the read threshold. Referring to FIG. 3 above, the MSP may estimate the optimal position of read threshold 76 by calculating only median 72A of distribution 68A (or only median 72B of distribution 68B).

As can be appreciated, the read threshold estimation methods described herein involve additional read operations, which cause an increase in computational complexity. In some embodiments, the MSP attempts to optimize read thresholds only in response to an indication that the currently-used read thresholds are not set properly. For example, the MSP may invoke the methods of FIGS. 3-5 in response to a failure to read the data, e.g., in response to an ECC decoding failure. In MLC configurations, if a particular read threshold in known to be the cause of failure, the MSP may adjust only this read threshold using the disclosed techniques. Alternatively, the MSP may adapt all the read thresholds or any desired subset of the read thresholds.

In some embodiments, the MSP may assume certain nominal positions of the programming level distribution medians. Consider, for example, a group (e.g., word line) of N memory cells, each storing data in M programming levels. Assume also that the MSP stores a nominal CDF, such as curve 64 in FIG. 2 above. Assuming that the data is randomized, the number of memory cells programmed to each programming level is approximately the same and is given by N/M. Under these assumptions, the nominal distribution medians meet the relation:

$$CDF(\text{median}) = \frac{N}{2M} + \frac{N}{M}K, K = 0, 1, 2, \ldots$$

The MSP can determine the nominal media positions from the stored CDF using the relation above. When the actual CDF differs from the stored CDF (e.g., because the data is not distributed uniformly among the different programming levels, or because of various impairments), the actual median locations may deviate from the nominal locations. Nevertheless, the MSP may use the nominal media locations as a first approximate for read threshold calculation. In some embodiments, when applying the methods of FIGS. 3-5, the MSP may position the intermediate read thresholds at the nominal median locations. This choice ensures with high likelihood that the intermediate read thresholds are located well within the interior of the programming level distribution.

When carrying out the methods of FIGS. 3-5, a trade-off exists between threshold setting accuracy (which reflects on read error performance) and computational complexity (which reflects on read threshold computation time). In order to reduce computation time, system 20 may estimate the medians and read thresholds over only a partial subset of the memory cells to be read. For example, in an N-cell word line, the system may estimate the medians and read thresholds over only N/2 or N/4 memory cells. This technique reduces the sampling time in the R/W unit, transfer time over the interface from the memory device to the MSP, and computation time in the MSP.

In some embodiments, the MSP stores multiple different CDFs, and selects the CDF that best matching CDF at any given time. The different stored CDFs may correspond, for example, to different wear levels of the memory cells (e.g., one CDF that best matches fresh memory cells, another CDF that well represents mid-life memory cells, and a third CDF that represents heavily-cycled memory cells). When calculation read thresholds for a given memory cell group, the MSP may choose the appropriate stored CDF based on any suitable criterion, such as the number of programming and erasure cycles the memory cells have gone through, previously-calculated read threshold positions in other cells groups (e.g., other word lines in the same block), or previously-estimated median locations in the same word lines.

In many MLC devices, different bits are read from the memory cells using respective, different read commands that use different sets of read thresholds. For example, in an eight-level MLC configuration, each memory cell stores three bits, which are referred to as a Least Significant Bit (LSB), a Central Significance Bit (CSB) and a Most Significant Bit (MSB). In a common reading scheme, the LSB is read using a read command having a single threshold, the CSB is read using a read command having a set of two thresholds, and the MSB is read using a read command having different set that includes four thresholds. In this example, the CSB and MSB read commands apply multiple read thresholds in a single read operation, and are therefore referred to herein as multi-threshold commands. Some aspects of reading memory cells using multi-threshold read commands are addressed, for example, in U.S. Patent Application Publication 2009/0106485, which is assigned to the assignee of the present patent application and whose disclosure is incorporated herein by reference.

In some embodiments, the MSP may read the memory cells using multiple intermediate read thresholds simultaneously by using the above-mentioned multi-threshold read commands. For example, in an eight-level MLC device, the MSP may sample four programming level distributions using a single MSB read command, which uses four read thresholds. This technique provides multiple CDF data points at a relatively short read time. Typically, however, in order to interpret the read results of the MSB read command, the MSP first needs to read the LSB and CSB bits of the cells (or otherwise obtain the LSB and CSB data).

Certain additional aspects of calculating read thresholds are addressed, for example, in PCT International Publications WO 2008/053472 and WO 2008/111058, which are assigned to the assignee of the present patent application and whose disclosures are incorporated herein by reference.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
storing data in a group of analog memory cells by writing into the memory cells in the group respective storage values, which program each of the analog memory cells to a respective programming state selected from a predefined set of programming states, including at least first and second programming states, which are applied respectively to first and second subsets of the memory cells, whereby the storage values held in the memory cells in the first and second subsets are distributed in accordance with respective first and second distributions;
estimating a first median of the first distribution;
calculating a read threshold, which differentiates between the first and second programming states, based on the estimated first median; and
retrieving the data from the analog memory cells in the group by reading the storage values using the calculated read threshold,
wherein the storage values corresponding to the first programming state lie in a given interval and wherein estimating the first median includes:
reading at least some of the storage values using one or more intermediate read thresholds, which are positioned inside of the given interval;
counting the storage values falling on a given side of each of the intermediate read thresholds; and
wherein assessing the first median comprises computing the first median based on the counted storage values.

2. The method according to claim 1, wherein estimating the first median comprises holding an estimated Cumulative Distribution Function (CDF) of the first distribution, and assessing the first median responsively to the storage values read using the intermediate read thresholds and to the estimated CDF.

3. The method according to claim 2, wherein estimating the first median comprises assessing the first median responsively to the estimated CDF and to the storage values read using only a single intermediate read threshold.

4. The method according to claim 2, wherein holding the estimated CDF comprises holding multiple estimated CDFs, and wherein assessing the first median comprises selecting one of the multiple CDFs in accordance with a predefined criterion, and assessing the first median using the selected estimated CDF.

5. The method according to claim 1, wherein counting the storage values comprises incrementing one or more hardware-based counters.

6. The method according to claim 1, wherein reading the storage values using the intermediate read thresholds comprises reading the storage values from only a partial subset of the memory cells in the group.

7. The method according to claim 1, wherein reading the storage values using the intermediate read thresholds comprises reading the storage values using two or more intermediate read thresholds in a single multi-threshold read command.

8. The method according to claim 1, wherein estimation of the first median and calculation of the read threshold are invoked responsively to a failure to successfully retrieve the data.

9. The method according to claim 1, and comprising calculating a second median of the second distribution, wherein calculating the read threshold comprises estimating the read threshold based on the first and second medians.

10. The method according to claim 9, wherein estimating the read threshold comprises calculating a first estimate of the read threshold based on the first median, calculating a second estimate of the read threshold based on the second median, and combining the first and second estimates.

11. The method according to claim 9, wherein estimating the first and second medians comprises holding predefined nominal values of the first and second medians, and assessing the first and second medians responsively to the nominal values.

12. Apparatus for data storage, comprising:
- an interface, which is coupled to communicate with a memory that includes multiple analog memory cells; and
- circuitry, which is configured to:
    - store data in a group of the analog memory cells by writing into the memory cells in the group respective storage values, which program each of the analog memory cells to a respective programming state selected from a predefined set of programming states, including at least first and second programming states, which are applied respectively to first and second subsets of the memory cells, whereby the storage values held in the memory cells in the first and second subsets are distributed in accordance with respective first and second distributions;
    - estimate a first median of the first distribution;
    - calculate a read threshold, which differentiates between the first and second programming states, based on the estimated first median, and
    - retrieve the data from the analog memory cells in the group by reading the storage values using the calculated read threshold;
- wherein the storage values corresponding to the first programming state lie in a given interval and wherein to estimate the first median the circuitry is configured to:
    - read at least some of the storage values using one or more intermediate read thresholds, which are positioned inside of the given interval,
    - count the storage values falling on a given side of each of the intermediate read thresholds; and
    - compute the first median based on the counted storage values.

13. The apparatus according to claim 12, wherein the circuitry is configured to store an estimated Cumulative Distribution Function (CDF) of the first distribution, and to assess the first median responsively to the storage values read using the intermediate read thresholds and to the estimated CDF.

14. The apparatus according to claim 13, wherein the circuitry is configured to assess the first median responsively to the estimated CDF and to the storage values read using only a single intermediate read threshold.

15. The apparatus according to claim 13, wherein the circuitry is configured to store multiple estimated CDFs, to select one of the multiple CDFs in accordance with a predefined criterion, and to assess the first median using the selected estimated CDF.

16. The apparatus according to claim 12, wherein the circuitry comprises one or more hardware-based counters, and is configured to count the storage values by incrementing the counters.

17. The apparatus according to claim 12, wherein the circuitry is configured to read the storage values using the intermediate read thresholds from only a partial subset of the memory cells in the group.

18. The apparatus according to claim 12, wherein the circuitry is configured to read the storage values using two or more intermediate read thresholds in a single multi-threshold read command.

19. The apparatus according to claim 12, wherein the circuitry is configured to estimate the first median and calculate the read threshold responsively to a failure to successfully retrieve the data.

20. The apparatus according to claim 12, wherein the circuitry is configured to calculate a second median of the second distribution, and to estimate the read threshold based on the first and second medians.

21. The apparatus according to claim 20, wherein the circuitry is configured to calculate a first estimate of the read threshold based on the first median, to calculate a second estimate of the read threshold based on the second median, and to calculate the read threshold by combining the first and second estimates.

22. The apparatus according to claim 20, wherein the circuitry is configured to store predefined nominal values of the first and second medians, and to assess the first and second medians responsively to the nominal values.

23. Apparatus for data storage, comprising:
- a memory comprising multiple analog memory cells; and
    - circuitry, which is configured to store data in a group of the analog memory cells by writing into the memory cells in the group respective storage values, which program each of the analog memory cells to a respective programming state selected from a predefined set of programming states, including at least first and second programming states, which are applied respectively to first and second subsets of the memory cells, whereby the storage values held in the memory cells in the first and second subsets are distributed in accordance with respective first and second distributions;
    - estimate a first median of the first distribution;
    - calculate a read threshold, which differentiates between the first and second programming states, based on the estimated first median, and
    - retrieve the data from the analog memory cells in the group by reading the storage values using the calculated read threshold;
- wherein the storage values corresponding to the first programming state lie in a given interval and wherein to estimate the first median the circuitry is configured to:
    - read at least some of the storage values using one or more intermediate read thresholds, which are positioned inside of the given interval,
    - count the storage values falling on a given side of each of the intermediate read thresholds; and
    - compute the first median based on the counted storage values.

24. The apparatus according to claim 23, wherein the circuitry is configured to store an estimated Cumulative Distribution Function (CDF) of the first distribution, and to assess the first median responsively to the storage values read using the intermediate read thresholds and to the estimated CDF.

25. The apparatus according to claim 24, wherein the circuitry is configured to assess the first median responsively to the estimated CDF and to the storage values read using only a single intermediate read threshold.

26. The apparatus according to claim 24, wherein the circuitry is configured to store multiple estimated CDFs, to select one of the multiple CDFs in accordance with a predefined criterion, and to assess the first median using the selected estimated CDF.

27. The apparatus according to claim 23, wherein the circuitry is configured to read the storage values using the intermediate read thresholds from only a partial subset of the memory cells in the group.

28. The apparatus according to claim 23, wherein the circuitry is configured to estimate the first median and calculate the read threshold responsively to a failure to successfully retrieve the data.

* * * * *